United States Patent [19]

Lequien

[11] 4,392,164

[45] Jul. 5, 1983

[54] METHOD OF AND APPARATUS FOR CONTROLLING THE GAIN OF CIRCUITRY RESPONSIVE TO READ HEAD OF A MEMORY

[75] Inventor: Jean Lequien, les Ulis, France

[73] Assignee: CII Honeywell Bull, Paris, France

[21] Appl. No.: 212,155

[22] Filed: Dec. 2, 1980

[30] Foreign Application Priority Data

Dec. 19, 1979 [FR] France .............................. 79 31080

[51] Int. Cl.³ .......................... G11B 5/02; G11B 5/09; G11B 21/10
[52] U.S. Cl. ....................................... 360/77; 360/39; 360/67
[58] Field of Search ....................... 360/77, 78, 67, 33, 360/39-40, 46

[56] References Cited

U.S. PATENT DOCUMENTS 3,725,885  4/1973  Andresen ............................. 360/39
4,074,325  2/1978  Sakai et al. ........................... 360/39
4,151,571  4/1979  Cardot et al. ........................ 360/77
4,298,898  11/1981 Cardot .................................. 360/39
4,326,226  4/1982  Touchton et al. ................... 360/77

OTHER PUBLICATIONS

IBM Tech. Disc. Bull., D. H. Martin, Data-Track-Following Servo System, vol. 14, No. 8, Jan. 1977, pp. 3228-3229.

Primary Examiner—Alfred H. Eddleman
Attorney, Agent, or Firm—Lowe, King, Price & Becker

[57] ABSTRACT

The amplitude of signals read by a head from a magnetic disc is controlled. The disc includes plural concentric tracks, each including data and reference zones. Each reference zone includes plural abutting tracks having a first axis. Each data zone includes a pair of abutting tracks having a second axis, with the first axis being displaced from the second axis by approximately one-half the radial width of a track. The head is desirably positioned so it is centered on a data zone and straddles a pair of reference zones. Each reference zone includes plural cells having magnetic flux transitions which cause the head to derive a pair of opposite polarity pulses as the cells move longitudinally relative to the head. The pulse amplitude is a function of (a) the distance separating the head from the disc, (b) the head radial position, and (c) the presence or absence of faults on the disc. The amplitude is controlled by deriving a first signal indicative of the deviation from a reference value of the absolute value of the derivative of the pulses. The first signal controls the gain of a variable gain amplifier while the data zone immediately following the reference zone moves longitudinally relative to the head.

18 Claims, 10 Drawing Figures

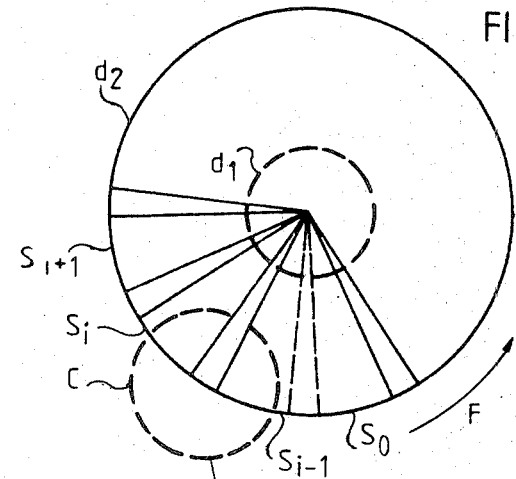
FIG. 1a
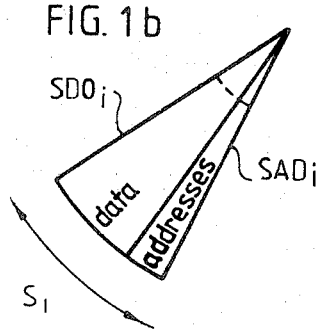
FIG. 1b
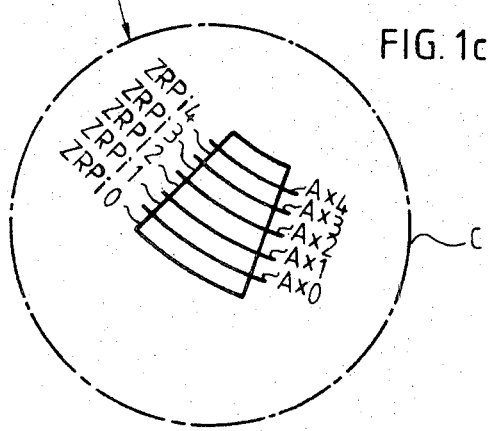
FIG. 1c
FIG. 1d
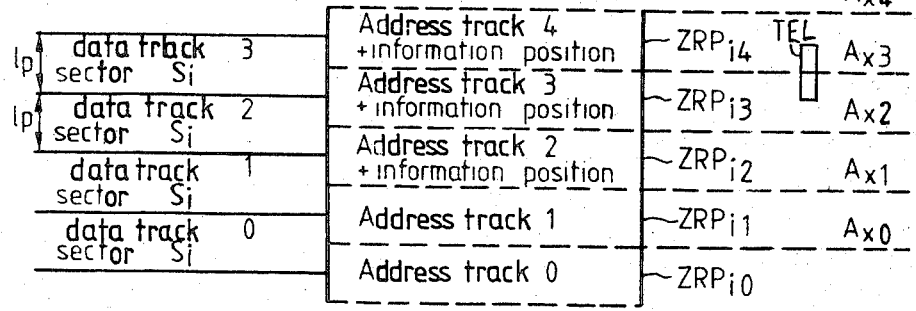
FIG. 1

METHOD OF AND APPARATUS FOR CONTROLLING THE GAIN OF CIRCUITRY RESPONSIVE TO READ HEAD OF A MEMORY

TECHNICAL FIELD

The present invention relates generally to a method of and apparatus for controlling the gain of amplifying circuits responsive to signals derived by a read or playback head responsive to data on a carrier and, more particularly, to controlling the gain as a function of the absolute value of the derivative of the head output as it moves relative to cells in a reference zone between data zones. The invention has particular application in setting the gain of an amplifier responsive to data read by a disc memory head.

BACKGROUND ART

In data processing systems, magnetic disc memory systems are frequently used because they have large storage capacity and require a relatively short time for a magnetic read/write head to access data contained anywhere on discs of the memory from the moment the head receives an instruction to access the data. The magnetic discs are driven at constant rotational velocity by an electric motor.

A magnetic disc carries data, usually in binary form, on both faces of the disc in concentric circular recording tracks having a width that does not exceed a few hundredths of a millimeter. The tracks are identified by alloting them an address or serial number j (j being a whole number) from 0 to (N−1), where N is the total number of recording tracks. The tracks having address (j−1) and (j+1) are adjacent track j.

Memories having a small storage capacity contain a limited number of discs (normally only one or two). In small memories, data are stored, i.e., recorded, on each of the disc faces by setting a large amount of space aside for the data intended to be processed by the data processing system of which the memories are a part. A small amount of space is set aside for data that enables the tracks to be located; these data indicate the track addresses and enable the magnetic head to be servo-controlled to a position above the tracks. In the small area are also stored data which indicate whether or not the tracks contain faults and preamble data that enable the gain of the amplifier circuits responsive to the head to be controlled.

For the sake of simplicity, a memory is considered which contains only a single disc. Preferably, each face of the disc is associated with a single magnetic read/write head, i.e., a magnetic read/write transducer. Current practice, as described in commonly assigned United States Patent Application Ser. No. 76,332, filed on Sept. 17, 1979, entitled "Method of Writing Information On a Magnetic Recording Medium", is for the data contained on each face of the disc to be distributed over equal adjacent circular sectors $S_0, S_1 \ldots S_i \ldots S_n$. Generally, one face of a disc is divided into several tens of sectors (usually forty to fifty).

When the magnetic disc face associated with the magnetic head passes in front of the head, sectors $S_0, S_1, S_2$, etcetera, are read by the head in sequence. It is therefore said that sector $S_0$ precedes sector $S_1$, that sector $S_1$ precedes sector $S_2$, that sector $S_i$ precedes sector $S_{i+1}$ and so on. In more general terms, if two items of information $I_{k-1}$ and $I_k$ which follow one another along the same track j on the face are considered, item $I_{k-1}$ precedes item $I_k$ if item $I_{k-1}$ is read by the head before item $I_k$, or that item $I_k$ follows item $I_{k-1}$. The same reasoning is applied to groups of information items $G_k$ and $G_{k-1}$ in a track (j+1) adjacent and abutting with track j.

Each sector $S_i$ is divided into two unequal areas. The larger area contains the data to be processed by the data processing system of which the disc memory is a part, while the smaller area contains data for locating the tracks, preamble data for controlling amplifier gain and data for indicating faults. In each sector, the smaller area is divided into a plurality of reference zones, one for each track, so each track is associated with a single reference zone.

It is recalled that a bit is a binary one or zero digit. The one or zero may be expressed on a magnetic medium or as an analog or logic electrical signal. A logic signal is capable of assuming only two values called "logic or binary zero" and "logic or binary one"; an analog signal is a signal having a voltage that may vary continuously between two positive and/or negative extreme values. Any item of data or information recorded on the disc is referred to herein as a "bit".

A magnetic head for writing information into and reading information from a magnetic disc includes a magnetic circuit comprising a high magnetic permeability material on which is mounted a winding and in which is formed an air gap. The air gap is substantially rectangular in shape, having a length much greater than its width. The gap is of the same order of magnitude as the radial width of the tracks and reference zones, which are of the same width. Thereby, the gap is responsive to magnetic flux variations representing data to be processed from a disc track having serial number j, as well as track identifying data contained in reference zones $ZRP_{ij}$ and $ZRP_{i(j+1)}$ associated with the data track having serial number j. The air gap of the head is disposed perpendicularly to magnetic axis $Ax_j$ of track j, i.e., the air gap is disposed parallel to the radial width of track j. To enable the data of track j to be read from the disc or written into the disc with maximum accuracy, the head remains stationary facing the track during the time necessary for reading or writing all or part of the data which the track contains while the disc rotates at constant velocity. The head air gap is perfectly centered on magnetic axis $Ax_j$, the boundary reference zones $ZRP_{ij}$ and $ZRP_{i(j+1)}$. The magnetic read/write head reads or writes track identifying data in reference zones $ZRP_{ij}$ and $ZRP_{i(j+1)}$ by being disposed astride the magnetic axis separating the two reference zones.

The data read by a head associated with a particular magnetic disc surface are supplied to an amplifier circuit prior to being coupled to additional processing circuitry. Data to be processed, read from the data zones, are supplied to electronic read circuits of the disc memory. The read circuits respond to these data to determine the binary values of data bits in the data zones. In contrast, data from the reference zone are supplied to circuitry for performing various control functions. For example, amplified signals derived from the amplifier in response to data read from the head correspond to addresses. The address signals are applied to a device for displacing the head with respect to the disc surface, as described in copending, commonly assigned United States Patent Application entitled "Apparatus And Method For Displacing A Movable System With Respect To A Data Carrier", Ser. No.

186,294, filed Sept. 11, 1980. In response to the address signals, the head is radially displaced from track A, where it was initially located, to track B where all or part of the data to be processed in the data zone is to be read. The amplifier also responds to the head, while in the reference zone, to derive signals indicative of the head position with respect to an axis of a track between a pair of abutting reference zones. These signals, indicative of transverse head position, are supplied to a device for controlling the position of the head so that it is desirably driven to straddle the axis between a pair of reference zones. A preferred device for controlling the head so it straddles a pair of reference zones is described in the copending, commonly assigned United States Application entitled "Apparatus For And Method Of Determining Transverse Position Of a Transducer Relative To Read Data Tracks", Ser. No. 205,863, filed Nov. 10, 1980.

It is desirable for the "data to be processed" read from the data zone of a track, which is to be read in whole or in part, to be read by the head as rapidly as possible and with maximum accuracy. In other words, it is desirable for the head output to have a miminum ratio of faults for the data to be processed. The ratio of faults is defined as the ratio between the number of data items having an incorrect value, as detected by a read circuit, and the total number of detected data items. It is desirable for the minimum ratio of faults to be considerably lower than $10^{-9}$. To achieve such a low ratio of faults, the period to displace the head from track A to track B should be as short as possible and the head gap should be centered above track B with as great an accuracy as possible, i.e., the head gap should be held perfectly astride the axis of track B. To assure this accuracy, it is also necessary for the read circuit to detect the value of the data to be processed with maximum accuracy.

To achieve the minimum ratio of faults, it is necessary for the amplitude of the analog signals derived by the amplifier circuits to be substantially constant at a sufficiently high amplitude. It is difficult to maintain the amplitude of the signals constant because the head output signal amplitude varies as a function of head radial position, assuming identical reading conditions at the different radial positions; identical reading conditions are considered to be conditions which result in the gap and disc to be separated by each other by the same amount, and the same relative position of the gap traversely of the data track. In particular, the amplitude of the signal derived from the head is greater when the head is aligned on a track situated at the periphery of the disc compared to when the head is aligned on a track adjacent the center of the disc. This is because the disc travels at a greater transverse speed relative to the head when the disc is positioned close to the periphery than when the head is positioned close to the disc center.

The output signal of the head is also a function of the distance between the head and the disc and faults which occur on the disc due to microscopic variations of evenness and flatness of the disc. In particular, dimensions of the order of one micron cause variations in the amplitude of the head output. Thereby, the amplitude of signals derived by the head corresponding to magnetic transitions forming data on the track in question may vary appreciably from one magnetic transition to another. Variations in the output of the amplifier also occur because a disc memory includes plural heads and plural discs, such that one head is associated with each disc surface in a typical situation. The amplitude of the signals derived from the different heads varies even under strictly identical reading conditions, i.e., with the same track serial number, same relative position of head gap with respect to data, same distance between the gap and disc surface associated with the head, and absence of faults of the magnetic recording layer.

Because of the variations of the amplitude of the signals derived by the head or heads as a function of these various factors, it is necessary for the gain of the amplifier circuits to be controlled. Otherwise, the desired minimum fault ratio is not achieved. The present practice is to control the gain of the amplifier circuits by signals corresponding to the preamble data recorded in a part of each reference zone $ZRP_{ij}$.

One known method of recording data on the face of a magnetic disc involves providing a succession of elementary areas of variable length over the entire length of each track and each zone by applying magnetic fluxes to the zones by the magnetic head. Alternate areas have magnetic inductions of the same amplitude, but of opposite polarity, whereby, for example, a first area has a magnetization of $+\phi$ and the adjacent area has a magnetization of $-\phi$. The bounary between two adjacent magnetic areas which follow one another along a track or zone defines a magnetization sense change ora "magnetic transition".

There are two different types of magnetic transistions, namely: when the magnetic head passes successive magnetic areas having negative and positive induction on the disc, the magnetization sense change is positive; and, when, on the other hand, the head passes successive areas having positive and negative induction, the magnetization sense change is negative.

In the present practice, the preamble data of each reference zone $ZRP_{ij}$ are recorded at the beginning of the reference zone so that they are chronologically the first data to be read as the zone is translated past the head. Thereby, the preamble data are read before the track location data. Typically, the preamble data consist of plural magnetic transitions which alternately differ in polarity and which follow each other within the reference zone.

In response to the preamble data, the head derives a signal that includes alternate analog pulses of opposite polarity. The analog pulses are coupled to a device for controlling the gain of the amplifier circuits. The device for controlling the gain of the amplifier circuits determines the absolute value of the maximum amplitude of the pulses and compares the absolute value of the maximum amplitude to a reference signal, to derive an error signal which controls the gain of the amplifier circuits. The gain of the amplifier circuits is thus a function of the amplitude and polarity of the error signal.

The prior art gain control device has been found to have a particular disadvantage. In particular, for a track having address j in the interval between a reference zone associated with sector $S_i$ to a reference zone of sector $S_{i+1}$, the maximum amplitude of the head output may vary by a relatively large amount relative to a reference level because of many of the reasons specified above, such as a fault in the recording layer or a variation in distance between the gap of the head and the disc surface. The relatively large variation in the maximum amplitude leads to a substantial variation of the gain of the amplifier circuits, and consequently of the amplitude of output signals derived from the amplifier circuits. Because of this factor, the risk of errors in considering the data and determining data values cannot be ignored, with regard to either the track location data contained in zone $ZRP_{ij}$ or in the following sector containing data to be processed.

It is, accordingly, an object of the present invention to provide a new and improved apparatus for and method of controlling the gain of circuitry responsive to signals read by playback heads from data carriers.

Another object of the invention is to provide a new and improved apparatus for and method of maintaining the amplitude of signals derived from different portions of a magnetic disc memory substantialy constant.

A further object of the present invention is to provide a new and improved apparatus for and method of maintaining the amplitude of signals read by different magnetic heads of a magnetic disc memory substantially constant.

An additional object of the invention is to provide a new and improved apparatus for and method of maintaining the amplitude of signals read from a magnetic disc memory substantially constant, despite variations in the radial position of a head, faults in a layer of the disc memory, and variations in distance between a head gap and a magnetic disc surface.

Still another object of the invention is to provide a new and improved apparatus for and method of maintaining the amplitude of signals read by a head responsive to a magnetic disc substantially constant, even though the maximum amplitude of a signal derived by the head from a reference zone varies by a relatively large amount.

DISCLOSURE OF THE INVENTION

The present invention overcomes the stated shortcomings of the prior art by controlling the gain of the amplifier circuits associated with the head by measuring, during a given period of time, the average absolute value of the derivative of the signals derived by the head in response to the preamble data. The average of the absolute value of the derivative of the signal derived by the head corresponding to the preamble data is compared to a reference value to derive an error signal that controls the gain of the amplifier circuits. The nature of the head output signal is such that differentiating the head output substantially eliminates the possibility of variations in the maximum amplitude relative to a reference value of zero to enable accurate control of the gain of the amplifier circuits. The differentiated head output is approximately a sinusoidal waveform that is converted into a DC signal having an amplitude dependent on the amplitude of the sinusoidal waveform.

Stated differently, the gain of the amplifying circuits responsive to a read head associated with a data carrier is controlled. The data carrier includes plural tracks having a sub-group of preamble data recorded within plural reference zones. Each track is associated with at least two zones. For each track, the average absolute value of the derivative of the signal derived by the variable gain circuits, corresponding to the preamble data of at least one of the two zones associated with the track, is calculated over a duration no greater than the time required to read the preamble data of the reference zone. The difference between the average value and a reference value is measured to derive an error indication. The gain of the circuits is controlled as a function of the error indication.

More particularly, the invention is directed to a method of and circuit for controlling the amplitude of signals read by a flux change responsive head from a magnetic disc. The magnetic disc includes plural concentric tracks, each of which includes a data zone and a reference zone. The reference zones of a pair of abutting tracks have a first axis, while the data zones of a pair of abutting tracks have a second axis. The first axes are displaced from the second axes by approximately one-half the radial width of a track. The head is desirably positioned so it is centered on a data zone and straddles a pair of reference zones of a particular track. Each reference zone includes plural cells having magnetic flux transitions which cause the head to derive a pair of opposite polarity pulses as the cells move longitudinally relative to the head. The amplitude of the pulses is a function of the distance separating the head from the disc, the radial position of the head and the presence and absence of faults on the magnetic disc. In response to the pulses derived by the head as the cells move longitudinally relative to the head, an indication is derived of the deviation from a reference value of the absolute value of the derivative of the pulses. The amplitude of a signal derived from the head as a data zone moves longitudinally relative to the head is controlled in response to the amplitude of the first signal.

The above and still further objects, features and advantages of the present invention will become apparent upon consideration of the following detailed description of one specific embodiment thereof, especially when taken in conjunction with the accompanying drawings.

BRIEF DESCRIPTION OF THE DRAWINGS

FIG. 1a-1d are schematic diagrams of a prefered topographical distribution of data on one face of a magnetic disc as known in the prior art;

BEST MODE FOR CARRYING OUT THE INVENTION

To provide a better understanding of the present invention, it is useful to review a few points of the prior art, as illustrated in FIGS. 1, 2, 3 and 4 wherein there is illustrated the manner in which preamble data are written within reference zones $ZRP_{ij}$ on the surface of magnetic disc D and the relationship of head TEL to the disc. Head TEL is of the type that is responsive to the time rate of change of magnetic flux variations written on disc D.

Magnetic disc D, FIG. 1a, rotates counterclockwise in the direction of arrow F and has a useful recording area bounded by inner and outer circles $d_1$ and $d_2$, respectively. On disc D are defined n equal and adjacent circular sectors $S_0, S_1 \ldots S_{i+1} \ldots S_{n-1}$. As seen in FIG.

2b, each sector $S_i$ is divided into two parts $SDO_i$ and $SAD_i$ having areas such that $SDO_i$ is much larger than $SAD_i$. In part $SDO_i$ are recorded data to be processed by a data processing system of which the disc memory is a part; in part $SAD_i$ are recorded track locating data (the addresses of the tracks and the data for controlling the position of the magnetic head TEL relative to the tracks), preamble data and fault indicating data.

FIGS. 1c and 1d are enlarged views of a portion of part $SAD_i$ contained in circle C, FIG. 1a. Each part $SAD_i$ of sector $S_i$ is divided into N zones $ZRP_{i0}$ ... $ZRP_{ij}$ ... $ZRP_{i(N-1)}$. For the sake of simplicity, only the first five zones $ZRP_{i0}$ to $ZRP_{i4}$ are shown and are represented as rectangles. The boundaries between the various reference zones $ZRP_{ij}$ are the circular magnetic axes $Ax_j$ of the recording tracks of the magnetic disc D. In each sector $S_i$, a track having serial number j and circular axis $Ax_j$ is associated with a reference zone $ZRP_{ij}$. Thus, track 0 is associated with reference zone $ZRP_{i0}$, track 1 is associated with zone $ZRP_{i1}$ and so on.

Reference zone $ZRP_{ij}$ contains preamble data and data for identifying the track of serial number j (address and position control data). Zone $ZRP_{i0}$ thus contains the preamble data and track location data for track 0, while zone $ZRP_{i1}$ contains the preamble data and track locating data for track 1, zone $ZRP_{i2}$ contains preamble and identifying data for the track of serial number 2, etcetera.

Figure 2:
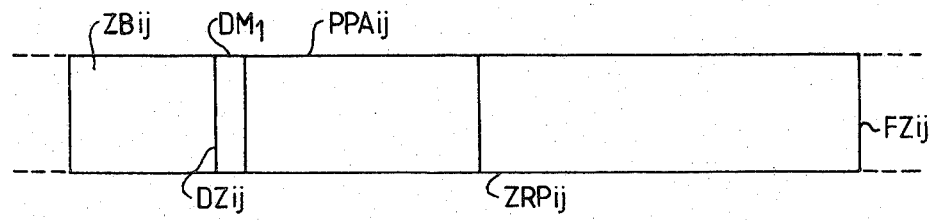
FIG. 2 is a schematic diagram of the manner in which data are recorded in a reference zone on the disc of FIG. 1.

Reference zone $ZRP_{ij}$ is illustrated in FIG. 2, with the direction of travel of disc D being denoted by arrow F. The preamble data of reference zone $ZRP_{ij}$ are contained in section $PPA_{ij}$ of the reference zone, as previously described. The remainder of zone $ZRP_{ij}$ following section $PPA_{ij}$ contains the address of the track containing serial number j. Reference zone $ZRP_{ij}$ is preceded by a blank zone $ZB_{ij}$, which follows section $SDO_{(i-1)}$ of sector $S_{(i-1)}$ containing data to be processed of sector $S_{(i-1)}$. In blank zone $ZB_{ij}$, there is a uniform magnetic induction, having a typical value of zero. The beginning of zone $ZRP_{ij}$ is indicated by reference $DZ_{ij}$ that is formed by a magnetic induction value change between zone $ZB_{ij}$, having the uniform, substantially zero magnetic induction, and the first zone $DM_1$ of zone $ZRP_{ij}$, having a negative magnetic induction. The first zone $DM_1$ of zone $ZRP_{ij}$ is the initial zone in preamble section $PPA_{ij}$. The end of reference zone $ZRP_{ij}$ occurs at position $FZ_{ij}$. Because of the direction of rotation of disc D, head TEL initially responds to zone $ZB_{ij}$, then to the transition at $DZ_{ij}$, then to numerous cells, such as cell $DM_1$ in preamble $PPA_{ij}$, and then to the position indicating data in the remainder of zone $ZRP_{ij}$.

Figure 3:
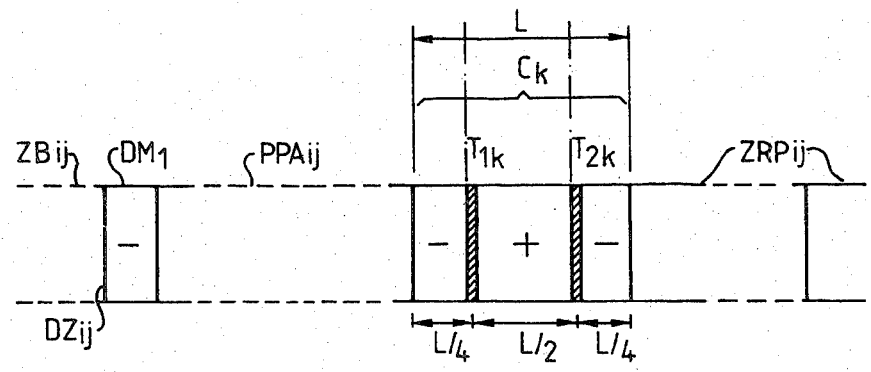
FIG. 3 is a schematic illustration of the manner in which preamble data for reference zone $ZRP_{ij}$ are written on the surface of the disc.

Reference is now made to FIG. 3 of the drawing wherein there is illustrated magnetic induction variations along the length of zone $ZRP_{ij}$. The preamble data in section $PPA_{ij}$ in reference zone $ZRP_{ij}$ includes a plurality of cells $C_k$, each having the same length L along the track containing zone $ZRP_{ij}$. Cells $C_k$ occur immediately after the first magnetic zone $DM_1$. Each of cells $C_k$ has an identical configuration. Thus, preamble data $I_{jk}$ of reference zone $ZRP_{ij}$ contained in cell $C_{jk}$ is defined by a double magnetic transition, such that a first transition $T_{1k}$ has a polarity opposite to that of a second transition $T_{2k}$. In the configuration specifically illustrated in FIG. 3, the first transition $T_{1k}$ is from negative to positive, whereas the second transition $T_{2k}$ is from positive to negative, whereby the first and second transitions are respectively positive and negative.

Transitions $T_{1k}$ and $T_{2k}$ of cell $C_k$ occur at positions that are one-quarter and three-quarters from the beginning of the cell, respectively. Thereby, the average magnetic induction of cell $C_k$ is zero and a magnetic pick-up head of the conventional type, which is responsive to the time rate of flux change, derives an AC output having a zero value as it passes over a single cell. In response to transitions $T_{1k}$ and $T_{2k}$, the head derives a waveform including positive and negative pulses, respectively. The waveform approximates one cycle of a sinusoid, preferably having an average value of zero, whereby the amplitudes of the two pulses are approximately the same. The durations of the two pulses are also approximately the same, equal to T/2, where T is the time required for cell $C_k$ to pass beneath head TEL.

Figure 4:
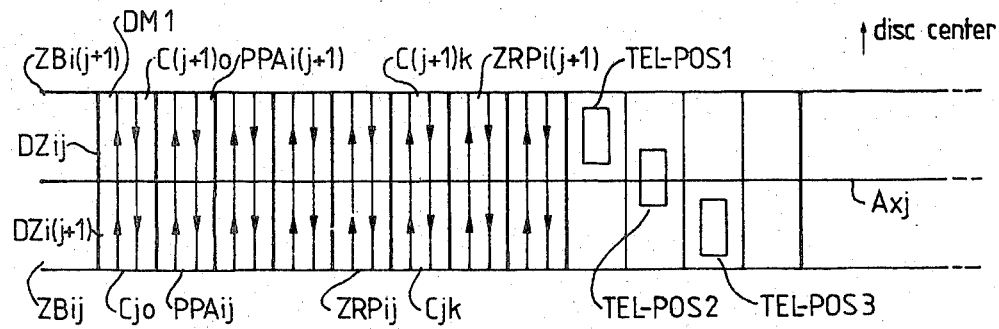
FIG. 4 is a schematic illustration of sections $PPA_{ij}$ and $PPA_{i(j+1)}$ containing preamble data of a pair of adjacent reference zones $ZRP_{ij}$ and $ZRP_{i(j+1)}$.

As illustrated in FIG. 4 and as described in previously referenced U.S. patent application No. 76,332, every section $PPA_{ij}$ of reference zone $ZRP_{ij}$ comprises, in a preferred embodiment, twelve identical longitudinally positioned cells of identical length L, such that each cell contains a double transition. The period required for head TEL to read the information contained in a single cell $C_k$ is equal to T. Section $PPA_{ij}$ thus contains twelve cells $C_{j0}$ ... $C_{jk}$ ... $C_{j12}$, each containing a double transition; section $PPA_{i(j+1)}$ includes twelve successive cells $C_{(j+1)0}$ ... $C_{(j+1)k}$ ... $C_{(j+1)12}$, each containing a double transition. Zone $DM_1$, mentioned supra, is actually part of cell $C_{j0}$.

In FIG. 4, the initial parts $DZ_{ij}$ and $DZ_{i(j+1)}$ of zones $ZRP_{ij}$ and $ZRP_{i(j+1)}$, respectively, are illustrated in the same manner. In FIG. 4, positive and negative magnetic transitions are respectively depicted by lines having upwardly and downwardly directed arrowheads. The boundary between sections $PPA_{ij}$ and $PPA_{i(j+1)}$ and, consequently, the boundary between zones $ZRP_{ij}$ and $ZRP_{i(j+1)}$, is magnetic axis $Ax_j$ of a track having serial number j.

When the air gap of head TEL is at postion $POS_1$, perfectly centered in alignment with reference zone $ZRP_{i(j+1)}$ which is closer to the center of disc D than reference zone $ZRP_{ij}$, the air gap is aligned with section $PPA_{i(j+1)}$ and occupies a transverse position relative to the axis $Ax_j$. When the air gap of head TEL is perfectly centered in alignment with reference zone $ZRP_{ij}$ that is farther from the center of disc D than zone $ZRP_{i(j+1)}$, the head is occupying position $POS_3$. When head TEL straddles axis $Ax_j$ of the track having serial number j, the head occupies position $POS_2$. Consequently, when the head straddles axis $Ax_j$ it is centered on the track containing data to be processed immediately preceding and immediately following reference zones $ZRP_{ij}$ and $ZRP_{i(j+1)}$. The positional information preferably maintains head TEL centered on axis $Ax_j$ while the head is reading data to be processed from track j. A preferred apparatus for maintaining such a relationship is disclosed in the previously mentioned copending application entitled "Apparatus For And Method Of Determining Transverse Position Of A Transducer Relative To Read Data Tracks".

Figure 6:
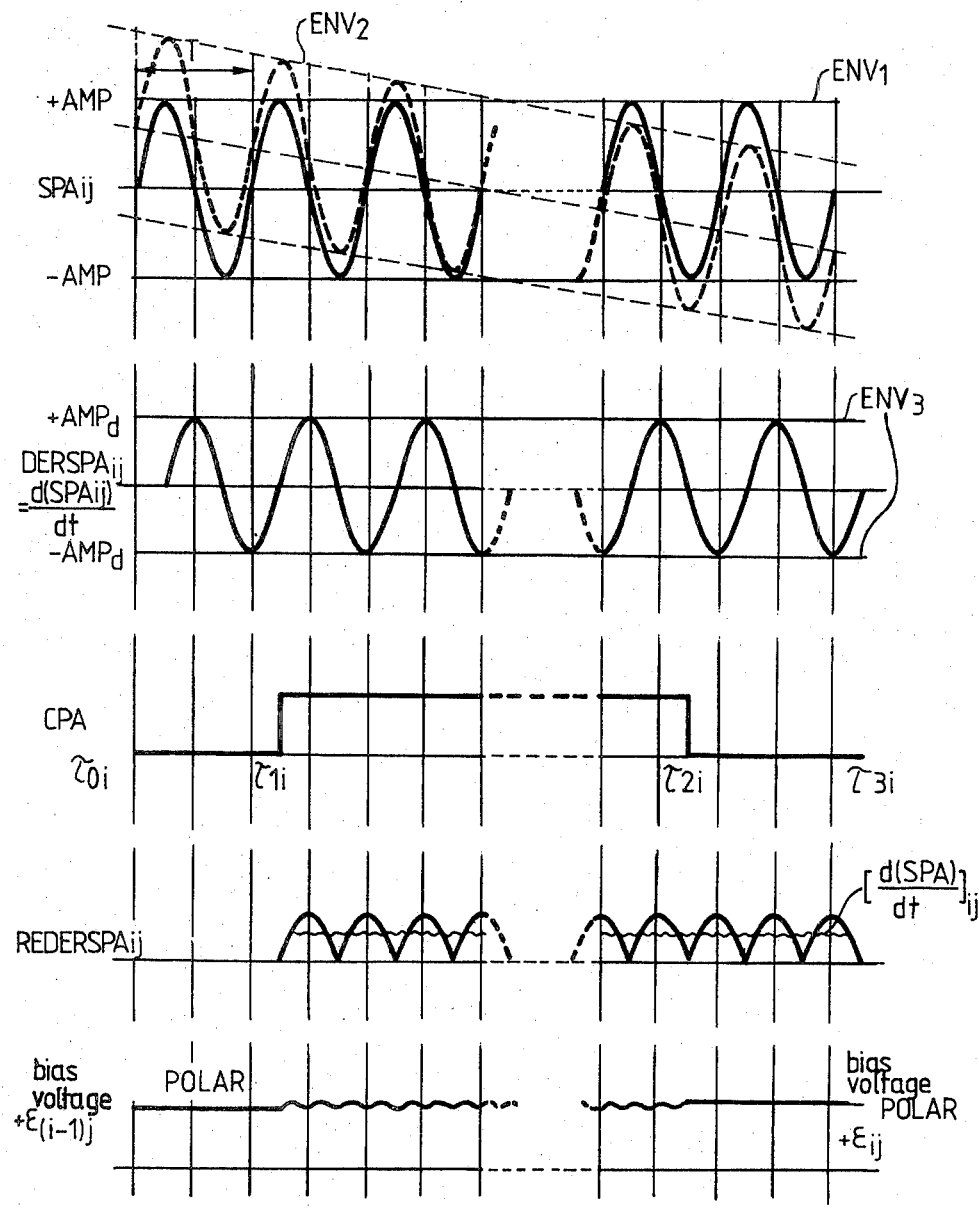
FIG. 6 is a series of waveforms for signals derived in the apparatus of FIG. 5.

As illustrated in FIG. 4, the transitions in preamble sections $PPA_{ij}$ and $PPA_{i(j+1)}$ of two adjacent reference zones $ZRP_{ij}$ and $ZRP_{i(j+1)}$ are the same. Thereby, the positive and negative transitions of cells $C_{jk}$ and $C_{(j+1)k}$ are aligned with each other. In response to sections $PPA_{ij}$ and $PPA_{i(j+1)}$ passing in front of head TEL, while the head occupies any one of positions $POS_1$, $POS_2$ or $POS_3$, or any positions from position $POS_1$ to position $POS_3$, the head derives signal $SPA_{ij}$, a cyclic signal having a period T, as illustrated in FIG. 6. When head TEL is at any position from position $POS_1$ to position $POS_3$, the head is stated to be in the neighborhood of boundary $Ax_j$. While head TEL is in the neighborhood of boundary $Ax_j$ and cells $C_{jk}$ and $C_{(j+1)k}$ of sections $PPA_{ij}$ and $PPA_{i(j+1)}$ move longitudinally relative to the head, the head derives two analog pulses of opposite polarity, with the same amplitude, waveform and duration $T/2$, regardless of the head position in the region from position $POS_1$ to $POS_3$. In response to sections $PPA_{ij}$ and $PPA_{i(j+1)}$ passing in front of head TEL, all of the analog pulses of signal $SPA_{ij}$ consist ideally of a sinusoidal waveform having an envelope $ENV_1$, illustrated in FIG. 6 by solid, horizontally extending lines with amplitudes $+AMP$ and $-AMP$.

Thus, all of the positive and negative pulses of signal $SPA_{ij}$ respectively have the amplitudes $+AMP$ and $-AMP$. However, because of various factors, such as variations in the distance separating head TEL from disc D, variations in the radial position of head TEL relative to disc D, and the presence or absence of faults on magnetic disc D, the pulses do not always have the same amplitude and duration and frequently assume an envelope as illustrated by dashed lines $ENV_2$, which includes a series of positive and negative pulses having different amplitude relative to a sloping reference line. The slopiing reference line approximately defines the average value of a pair of pulses for each cell but differs considerably from the average for the idealized zero value for the signal within envelope $ENV_1$.

Sloping envelope $ENV_2$ defeats one of the most important purposes of the preamble of the reference zone. In particular, the purpose of the preamble is to establish the gain for amplifier circuits responsive to the remaining signals of the reference zone and of the data to be processed of the following sector having the same track serial number. In the prior art, the gain of the amplifier circuits was established in response to the maximum amplitude of pulses in the preamble, i.e., in response to the preamble envelope. Variations in the preamble envelope, as indicated by envelope $ENV_2$, prevent accurate control of the gain of the amplifier circuits. The purpose of the present invention is to control the gain of the amplifying circuits responsive to head TEL in such a manner that the signals derived by the amplifying circuits have an amplitude which is substantially constant. The amplitude derived by the circuits also has sufficiently large value to avoid errors by electronic circuits responsive to the data to be processed or the device for radially displacing head TEL with respect to the surface of disc D, or the device for servo-controlling the position of the head so that it is preferably centered on a track containing data to be processed, anywhere between the center and periphery of the disc.

In accordance with the present invention, the gain of the amplifier circuits is controlled for each track of serial number j and in each section $S_i$ in response to the preamble in reference zones $ZRP_{ij}$ and $ZRP_{i(j+1)}$ by calculating the average of the absolute value of the differentiated amplitude of signal $SPA_{ij}$ over a time interval having a duration no greater than the time required to read all of the preamble data of sections $PPA_{ij}$ and $PPA_{i(j+1)}$, i.e., $12T$. As illustrated in FIG. 6, the period of time during which head TEL is responsive to the preamble data extends from time $\tau_{0i}$ to time $\tau_{3i}$, where $\tau_{0i}$ is the time when reading of the preamble data is initiated and time $\tau_{3i}$ is the time when the reading of the preamble data terminates. In practice, the time period during which the average value is calculated extends from time $\tau_{1i}$ to time $\tau_{2i}$, an interval less than the time from $\tau_{0i}$ to $\tau_{3i}$, such that $\tau_{1i}$ occurs after $\tau_{0i}$ and $\tau_{2i}$ occurs before time $\tau_{3i}$. The time from $\tau_{1i}$ to time $\tau_{2i}$ equals $nT/2$, where n is a positive integer.

The average of the absolute value of the differentiated amplitude of signal $SPA_{ij}$ is derived by supplying signal $SPA_{ij}$ to an electronic differentiator which derives output signal $DERSPA_{ij}=d(SPA_{ij})/dt$. Signal $DERSPA_{ij}$, as illustrated in FIG. 6, is approximately a sinusoidal waveform having a constant average value of zero, with a constant maximum amplitude $ENV_3$. Signal $DERSPA_{ij}$ is ninety degrees out of phase with respect to signal $SPA_{ij}$. Thus, signal $DERSPA_{ij}$ is equivalent, with a proportionality factor, to an idealized form of signal $SPA_{ij}$, as phase shifted by ninety degrees. It can be showed that, even if signal $SPA_{ij}$ does not have an idealized waveform and no matter what the form of the envelope $ENV_2$ in which signal $SPA_{ij}$ is inscribed, signal $DERSPA_{ij}$ is inscribed within a constant amplitude envelope $ENV_3$, which contains positive and negative analog pulses respectively having substantially the same amplitudes $+AMP_d$ and $-AMP_d$.

From the foregoing, it is more advantageous, because of higher accuracy, to calculate the mean or average value of the absolute value of signal $DERSPA_{ij}$ than the average value of signal $SPA_{ij}$. Because of the presence of envelope $ENV_2$, the means of the absolute value of signal $SPA_{ij}$ is very frequently quite small.

After the average of the absolute value of the differentiated amplitude of signal $SPA_i$ has been calculated, the average value is compared with a reference value REF, to derive an error indication $\epsilon_{ij}$ proportional to $(\bar{V}\text{-}REF)$, where $\bar{V}=|(D(SPA_{ij}/dt)|$. The gain $G_v$ of the amplifier circuits is controlled as a function of the value $\epsilon_{ij}$ in such a manner that $\epsilon_{ij}$ has a tendency to be reduced to a zero value. In response to $\epsilon_{ij}$ being respectively greater and less than zero, gain $G_v$ is respectively reduced and increased. Thus, varying the gain $G_v$ reduces $\epsilon_{ij}$ toward zero. For example, if $\bar{V}$ is greater than REF, $G_v$ is reduced, which causes the absolute value of signal $SPA_{ij}$ to be reduced, which in turn reduces the absolute value of the derivative of $SPA_{ij}$, i.e., the absolute value of signal $DERSPA_{ij}$. Thus, the direction of variation of the average value of the absolute value of each of signals $SPA_{ij}$ and $DERSPA_{ij}$ is identical.

The value of $\epsilon_{ij}$ obtained at the completion of the interval while the preamble data are read, i.e., at time $\tau_{2i}$, is stored and blocked until time $\tau_{1(i+1)}$, when the reading of the preambled data of zones $ZRP_{(i+1)j}$ and $ZRP_{i+1)(j+1)}$ of sector $S_{(i+1)}$, following sector $S_i$ on disc D, is initiated.

Figure 5:
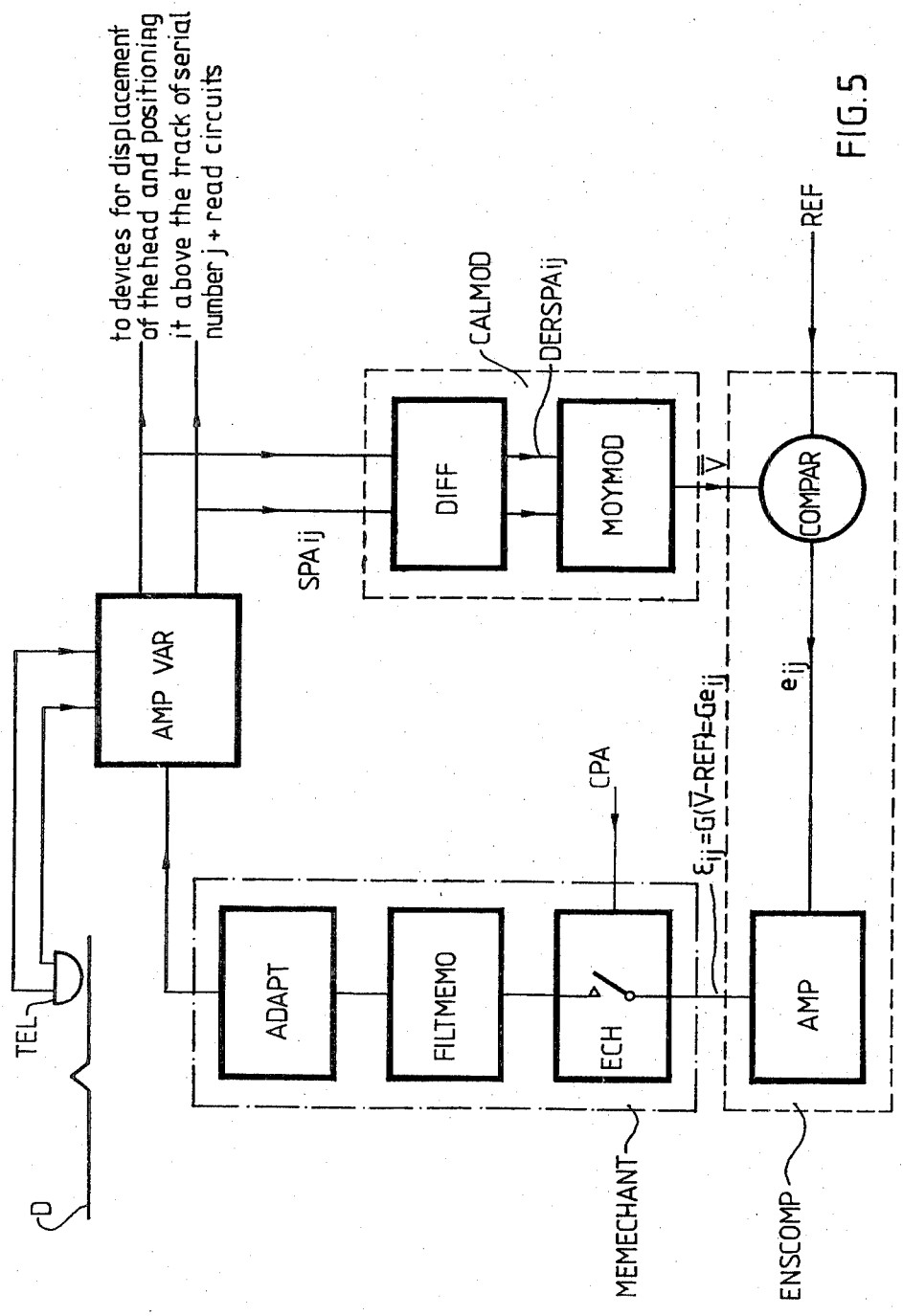
FIG. 5 is a block diagram of a device in accordance with the invention for controlling the gain of amplifying circuits for signals read by a head associated with the disc illustrated in FIGS. 1–4.

Reference is now made to FIG. 5 of the drawing wherein there is illustrated, in block diagram form, apparatus for performing the method associated with the waveforms of FIG. 6. The apparatus of FIG. 5 includes a disc D and head TEL which responds to the time rate of flux change on disc D. The output signal of head TEL is supplied to input terminals of variable amplifier AMPVAR which derives output signal $SPA_{ij}$. In response to the preamble magnetic flux changes illustrated in FIG. 4, the output of amplifier AMPVAR is frequently as illustrated by the dashed lines in the first waveform line of FIG. 6. The output of variable amplifier AMPVAR is supplied to devices for radially displacing head TEL relative to disc D and for servocontrolling the head position above the track having serial number j. In addition, the output of variable amplifier AMPVAR is supplied to calculator CALMOD for the average value V of the absolute value of the derivative of signal $SPA_{ij}$. Output signal V of calculator CALMOD is supplied to comparator circuit ENSCOMP which derives a DC error signal having a value $\epsilon_{ij}$ responsive to the deviation of the magnitude of DC signal V from a DC reference value REF. The DC error output signal $\epsilon_{ij}$ of comparator ENSCOMP is supplied to sample and hold circuit MEMECHANT which stores and blocks the value of $\epsilon_{ij}$ so that the stored and sampled value of $\epsilon_{ij}$ is periodically supplied as a gain control input to variable amplifier AMPVAR.

Calculator circuit CALMOD responds to signal $SPA_{ij}$, as illustrated in FIG. 1, to derive a DC signal having a value V proportional to the absolute value of the derivative representing signal $DERSPA_{ij}$ (FIG. 6) during the interval from $\tau_{1i}$ to $\tau_{2i}$. Comparator circuit ENSCOMP responds to the magnitudes of signals V and REF to derive the DC signal directly proportional to $\epsilon_{ij}$ at time $\tau_{2i}$. The value of $\epsilon_{ij}$ derived from circuit ENSCOMP at time $\tau_{2i}$ is retained in a storage device of MEMECHANT and coupled to variable amplifier AMPVAR during the interval from time $\tau_{1i}$ to time $\tau_{1(i+1)}$ at which time head TEL encounters zones $ZRP_{(i+1)j}$ and $ZRP_{(i+1)(j+1)}$ of sector $S_{(i+1)}$, which follows sector $S_i$ on disc D.

As illustrated in FIG. 5, calculator circuit CALMOD includes differentiator DIFF which responds to output signal $SPA_{ij}$ of variable amplifier AMPVAR to derive signal $DERPAS_{ij}$. The AC output $DERSPA_{ij}$ of differentiator DIFF is supplied to input terminals of calculating circuit MOYMOD, illustrated in detail in FIG. 7. Calculator MOYMOD basically provides full wave rectification of signal $DERSPA_{ij}$ and determines the average value of the full wave rectified signal over the interval from time $\tau_{1i}$ to time $\tau_{2i}$.

Output signal $\bar{V}$ of MOYMOD is supplied to one input of an analog comparator network COMPAR, having a second analog input responsive to a DC voltage indicative of the reference value REF. Comparator circuit COMPAR algebraically combines the magnitudes of the two input signals thereof to derive output signal $e_{ij}$ proportional to ($\bar{V}$-REF). DC analog signal $e_{ij}$ is supplied to an input terminal of DC amplifier AMP, having a relatively high gain G, whereby amplifier AMP derives a DC output signal $\epsilon_{ij}$ having a magnitude equal to $G(e_{ij})$.

Sample and hold circuit MEMECHANT includes a sampling circuit ECH responsive to the DC output of amplifier AMP. Sampling circuit ECH is basically a switch that is closed during the interval between time $\tau_{1i}$ and time $\tau_{2i}$. In a preferred embodiment, sampling circuit ECH is a field effect transistor, for example, a DMOS transistor of type SD 215, available from Signetics. The switch in sampling circuit ECH is open during the interval from time $\tau_{2i}$ until time $\tau_{1(i+1)}$. Sampling circuit ECH responds to signal $SPA_{ij}$, as derived from a suitable timing source, and as illustrated in the third line of waveforms in FIG. 6.

The DC sampled output of sampling circuit ECH is supplied to an analog memory circuit FILTMEMO, which is basically a low pass filter having a very long response time. Filter-memory FILTMEMO stores the signal coupled through sampler ECH during the period from time $\tau_{1i}$ to time $\tau_{2i}$ and stores the value of $\epsilon_{ij}$, derived from sampler ECH at time $\tau_{ti}$ between time $\tau_{ti}$ until time $\tau_{1(i+1)}$. Filter-memory FILTMEMO is preferably formed by a series resistor and shunt capacitor. The series resistor has a large enough value to prevent discharge of the storage capacitor and assure the memory function of the filter memory, so that the voltage across the capacitor is maintained relatively constant and equal to or proportional to the value of $\epsilon_{ij}$ during the interval from $\tau_{2i}$ to $\tau_{1(i+1)}$. The DC output of FILTMEMO is applied to input terminals of impedance matching network ADAPT, having output terminals coupled to gain control input terminals of variable amplifier AMPVAR. Impedance matching network ADAPT matches the high output impedance of filter memory FILTMEMO to the relatively low input impedance of the gain control terminals of circuits AMPVAR.

Figure 7:
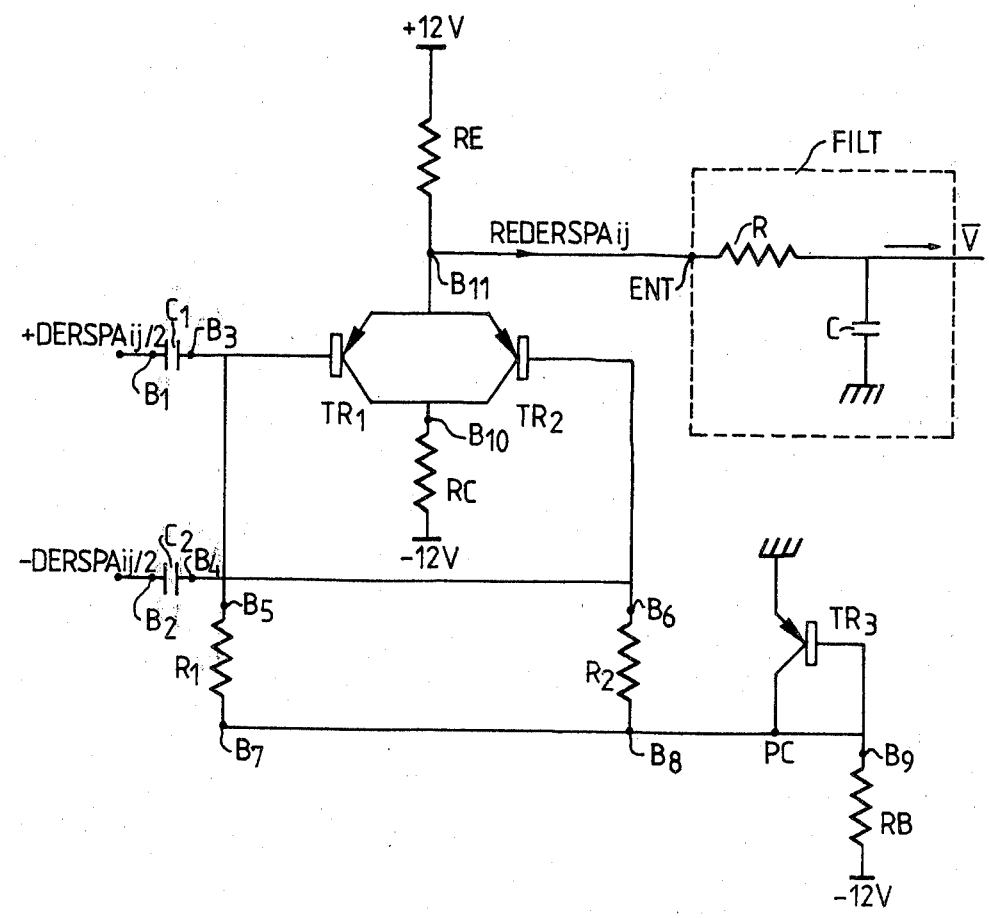
FIG. 7 is a circuit diagram of a part of the apparatus illustrated in FIG. 5.

Reference is now made to FIG. 7 of the drawing wherein there is illustrated a circuit diagram of a preferred embodiment of calculator circuit MOYMOD. Calculator circuit MOYMOD is responsive to a pair of one hundred eighty degree phase displaced replicas $+DERSP_{ij}/2$ and $-DERSPA_{ij}/2$ of $DERSPA_{ij}$, as derived from differential output terminals of differentiator DIFF. Signals $+DERSPA_{ij}/2$ and $-DERSPA_{ij}/2$ are coupled to input electrodes $B_1$ and $B_2$ of coupling capacitors $C_1$ and $C_2$, respectively. Output terminals $B_3$ and $B_4$ of capacitors $C_1$ and $C_2$ are DC coupled to the emitters of matched NPN transistors $TR_1$ and $TR_2$, respectively.

Transistors $TR_1$ and $TR_2$ are connected as a differential amplifier having common collector electrodes connected to terminal $B_{10}$, in turn connected to a $-12$ volt negative DC power supply terminal through resistor RC. The emitters of transistors $TR_1$ and $TR_2$ have a common connection to terminal $B_{11}$, in turn connected by emitter load resistor RE to a $+12$ volt DC power supply terminal. The bases of transistors $TR_1$ and $TR_2$ are connected to terminals $B_5$ and $B_6$ of resistors $R_1$ and $R_2$, respectively; resistors $R_1$ and $R_2$ have further terminals $B_7$ and $B_8$, connected to a stabilized DC power supply terminal PC that is maintained at a predetermined negative bias voltage by virtue of the connection of the emitter collector path of NPN transistor $TR_3$ between ground and terminal PC. Terminal PC is connected to the base of transistor $TR_3$ and to terminal $B_9$ of bias resistor RB, having a second terminal connected to the $-12$ volt DC power supply terminal. The circuitry including resistor RB and transistor $TR_3$, together with resistors $R_1$ and $R_2$ assures that transistors $TR_1$ and $TR_2$ are biased in such a manner that the voltage at the common emitter terminal $B_{11}$ of the transistors is close to zero when no input signal is applied to the bases of the transistors. The connection of transistor $TR_1$, resistor $R_1$ and capacitor $C_1$ and of transistor $TR_2$, resistor $R_2$ and capacitor $C_2$ assures full wave rectification of signal $DERSPA_{ij}$. Full wave rectification of signal $DERSPA_{ij}$ is equivalent to calculating the absolute value of signal $DERSPA_{ij}$. The resulting full wave rectified signal derived across resistor RE thus consists of a series of positive rectified sinusoids, as indicated by waveform $REDERSPA_{ij}$.

Signal $REDERSPA_{ij}$ is applied to low pass filter FILT which effectively functions as an integrator or average value determining circuit for signal $REDERSPA_{ij}$. Integrator FILT includes a series resistor R having one terminal ENT connected directly to terminal $B_{11}$, and a second terminal connected to shunt capacitor C, which is grounded. The voltage developed at the common terminal for resistor R and capacitor C is a DC voltage having a magnitude directly proportional to $\bar{V}$.

The amplitude of signal $\bar{V}$ is thus the average of the absolute value of the derivative of signal $SPA_{ij}$.

While there has been described and illustrated several specific embodiments of the invention, it will be clear that variations in the details of the embodiment specifically illustrated and described may be made without departing from the true spirit and scope of the invention as defined in the appended claims.

I claim:

1. A circuit for controlling the amplitude of signals read by a flux change responsive head from a magnetic disc including plural concentric tracks, each of said tracks including a data zone and a reference zone, the reference zones of a pair of abutting tracks having a first axis, the data zones of a pair of abutting tracks having a second axis, the first axis being displaced from the second axis by approximately one-half the radial width of a track, the head desirably being positioned so it is centered on a data zone and straddles a pair of reference zones, each reference zone including plural cells having magnetic flux transitions which cause the head to derive a pair of opposite polarity pulses as the cells move longitudinally relative to the head, the amplitude of the pulses being a function of: (a) the distance separating the head from the disc; (b) the radial position of the head, and (c) the presence or absence of faults on the magnetic disc so that a pair of the pulses have a waveform approximating a sinusoid with an average value subject to change from cell to cell, said control circuit comprising means responsive to the pulses derived by the head as the cells move longitudinally relative to the head for deriving a first signal indicative of the deviation from a reference value of the absolute value of the derivative of the pulses, and means for controlling the amplitude of a signal derived from the head as a data zone moves longitudinally relative to the head in response to the amplitude of the first signal.

2. The circuit of claim 1 wherein the amplitude of the signal that is controlled immediately follows the reference zone.

3. A circuit for controlling the amplitude of signals read by a flux change responsive head from a magnetic disc including concentric tracks, each of said tracks including a data zone and a reference zone, the reference zones of a pair of abutting tracks having a first axis, the data zones of a pair of abutting tracks having a second axis, the first axis being displaced from the second axis by approximately one-half the radial width of a track, the head desirably being positioned so it is centered on a data zone and straddles a pair of reference zones, each reference zone including plural cells having magnetic flux transitions which cause the head to derive a pair of opposite polarity pulses as the cells move longitudinally relative to the head, the amplitude of the pulses being a function of: (a) the distance separating the head from the disc, (b) the radial position of the head, and (c) the presence or absence of faults on the magnetic disc so that a pair of the pulses have a waveform approximating a sinusoid with an average value subject to change from cell to cell, said control circuit comprising means responsive to the pulses derived by the head as the cells move longitudinally relative to the head for modifying the approximately sinusoidal waveforms so that the average value of the waveform from cell to cell is maintained constant thereby to derive a modified approximately sinusoidal waveform, means for converting the modified approximately sinusoidal waveform into a DC signal having an amplitude dependent on the amplitude of the modified approximately sinusoidal waveform, and means for controlling the amplitude of a signal derived from the head as a data zone moves longitudinally relative to the head in response to the amplitude of the first signal.

4. The circuit of claim 3 wherein the DC signal has an amplitude dependent on the amplitude and shape of the approximately sinusoidal waveform.

5. The circuit of claim 3 wherein the DC signal has an amplitude dependent on the average of the absolute value of the approximately sinusoidal waveform.

6. The circuit of claim 3, 4 or 5 wherein the amplitude of the signal that is controlled immediately follows the reference zone.

7. A method for controlling the gain of amplifying circuits for deriving signals that are replicas of signals derived by a read or playback head associated with a carrier for data on a plurality of tracks, each of said tracks including a sub-group of preamble data recorded within a plurality of reference zones, each track including at least two zones, said method comprising for each track:

calculating the average of the absolute value of the derivative of the signal derived by the amplifying circuits while the amplifying circuits are deriving a signal corresponding to the preamble data of at least one of two zones associated with the track, said average of the absolute value being calculated during a period having a maximum duration equal to the time required to read the preamble data of the zone;

measuring the deviation between said average and a reference value; and controlling the gain of said amplifying circuits as a function of said deviation.

8. The method of claim 7 wherein the average of the derivative of the signal is calculated by:

differentiating the signal, thereby to obtain a differentiated signal;

rectifying the differentiated signal to obtain the absolute value of the differentiated signal; and calculating the average of the absolute value of the differentiated signal.

9. The method of claim 7 wherein the signal commensurate with the average of the derivative of the signal is derived by:

differentiating the signal derived by the head while the head is responsive to the preamble data, thereby to obtain a differential signal;

rectifying the differentiated signal to derive a signal commensurate with the absolute value of the differentiated signal; and responding to the signal commensurate with the absolute value of the differentiated signal to derive the signal commensurate with the average of the absolute value of the differentiated signal.

10. Apparatus for controlling the gain of amplifying circuits for deriving signals that are replicas of signals derived by a read or playback head associated with a carrier for data on a plurality of tracks, each of said tracks including a sub-group of preamble data recorded within a plurality of reference zones, each track including at least two zones, said apparatus comprising:

means responsive to signals derived by the amplifying circuits for deriving a signal having a magnitude commensurate with the average of the absolute value of the derivative of the signal derived by the amplifying circuits while the amplifying circuits are deriving a signal corresponding to the preamble data of at least one of two zones associated with one track, said signal commensurate with the average of the absolute value being derived during a period having a maximum duration equal to the time required to read the preamble data of the zone;

means for comparing the magnitude of the signal commensurate with the average of the absolute value with a reference value to derive an error signal; and means for controlling the gain of said amplifying circuits as a function of said error signal.

11. The apparatus of claim 10 wherein the means for deriving the signal commensurate with the average of the derivative of the signal includes:

means for differentiating the signal derived by the head while the head is responsive to the preamble data, thereby to obtain a differentiated signal;

means for rectifying the differentiated signal to derive a signal commensurate with the absolute value of the differentiated signal; and means responsive to the signal commensurate with the absolute value of the differentiated signal for deriving the signal commensurate with the average of the absolute value of the differentiated signal.

12. Apparatus for controlling the amplitude of signals derived from a magnetic data carrier comprising a head associated with the data on the carrier in a plurality of tracks, said head deriving an output signal in accordance with flux changes on the carrier, each of said tracks including a sub-group of preamble data recorded within a plurality of reference zones, each track including at least two zones:

variable gain amplifying circuits responsive to the head output signal for deriving a signal that is a replica of the head output signal;

means responsive to signals derived by the variable gain amplifying circuits for deriving a signal having a magnitude commensurate with the average of the absolute value of the derivative of the signal derived by the variable gain amplifying circuits while the variable gain amplifying circuits are deriving a signal corresponding to the preamble data of at least one of two zones associated with one track, said signal commensurate with the average of the absolute value being derived during a period having a maximum duration equal to the time required to read the preamble data of the zone;

means for comparing the magnitude of the signal commensurate with the average of the absolute value with a reference value to derive an error signal; and means for controlling the gain of said variable gain amplifying circuits as a function of said error signal.

13. A method for controlling the amplitude of signals read by a flux change responsive head from a magnetic disc including plural concentric tracks, each of said tracks including a data zone and a reference zone, the reference zones of a pair of abutting tracks having a first axis, the data zones of a pair of abutting tracks having a second axis, the first axis being displaced from the second axis by approximately one-half the radial width of a track, the head desirably being positioned so it is centered on a data zone and straddles a pair of reference zones, each reference zone including plural cells having magnetic flux transitions which cause the head to derive a pair of opposite polarity pulses as the cells move longitudinally relative to the head, the amplitude of the pulses being a function of: (a) the distance separating the head from the disc, (b) the radial position of the head, and (c) the presence or absence of faults on the magnetic disc so that a pair of the pulses have a waveform approximating a sinusoid with an average value subject to change from cell to cell, said method compising deriving a first signal indicative of the deviation from a reference value of the absolute value of the derivative of the pulses in response to the pulses derived by the head as the cells move longitudinally relative to the head, and controlling the amplitude of a signal derived from the head as a data zone moves longitudinally relative to the head in response to the amplitude of the first signal.

14. The method of claim 13 wherin the amplitude of the signal that is controlled immediately follows the reference zone.

15. A method for controlling the amplitude of signals read by a flux change responsive head from a magnetic disc including concentric tracks, each of said tracks including a data zone and a reference zone, the reference zones of a pair of abutting tracks having a first axis, the data zones of a pair of abutting tracks having a second axis, the first axis being displaced from the second axis by approximately one-half the radial width of a track, the head desirably being positioned so it is centered on a data zone and straddles a pair of reference zones, each reference zone including plural cells having magnetic flux transitions which cause the head to derive a pair of opposite polarity pulses as the cells move longitudinally relative to the head, the amplitude of the pulses being a function of: (a) the distance separating the head from the disc, (b) the radial position of the head, and (c) the presence or absence of faults on the magnetic disc so that a pair of pulses have a waveform approximating a sinusoid with an average value subject to change from cell to cell, said method comprising modifying the approximately sinusoidal waveforms derived by the head so that the average value of the waveform from cell to cell is maintained constant thereby to derive a modified approximately sinusoidal waveform, converting the modified approximately sinusoidal waveform into a DC signal having an amplitude dependent on the amplitude of the modified approximately sinusoidal waveform, and controlling the amplitude of a signal derived from the head as a data zone moves longitudinally relative to the head in response to the amplitude of the first signal.

16. The method of claim 15 wherein the DC signal has an amplitude dependent on the amplitude and shape of the approximately sinusoidal waveform.

17. The method of claim 15 wherein the DC signal has an amplitude dependent on the average of the absolute value of the approximately sinusoidal waveform.

18. The method of claim 15, 16 or 17 wherein the amplitude of the signal that is controlled immediately follows the reference zone.

* * * * *